(12) United States Patent  
Sun et al.

(10) Patent No.: US 9,136,267 B2  
(45) Date of Patent: Sep. 15, 2015

(54) STANDARD CELL GLOBAL ROUTING CHANNELS OVER ACTIVE REGIONS

(71) Applicant: OMNIVISION TECHNOLOGIES, INC., Santa Clara, CA (US)

(72) Inventors: Tianjia Sun, Santa Clara, CA (US); Lingchuan Li, Santa Clara, CA (US); Shumin Wu, Shanghai (CN)

(73) Assignee: OmniVision Technologies, Inc., Santa Clara, CA (US)

( * ) Notice: Subject to any disclaimer, the term of this patent is extended or adjusted under 35 U.S.C. 154(b) by 34 days.

(21) Appl. No.: 14/175,847

(22) Filed: Feb. 7, 2014

(65) Prior Publication Data

US 2015/0228650 A1 Aug. 13, 2015

(51) Int. Cl.  
*H01L 29/73* (2006.01)  
*H01L 27/092* (2006.01)  
*H01L 23/528* (2006.01)

(52) U.S. Cl.  
CPC ............ *H01L 27/092* (2013.01); *H01L 23/528* (2013.01)

(58) Field of Classification Search  
CPC ............ H01L 27/11807; H01L 23/528; H01L 27/0207  
See application file for complete search history.

(56) References Cited

U.S. PATENT DOCUMENTS

| 5,723,883 A | 3/1998 | Gheewalla |
| 8,742,464 B2* | 6/2014 | Sherlekar et al. ............. 257/207 |
| 2009/0193367 A1* | 7/2009 | Deppe et al. ...................... 716/1 |
| 2012/0223368 A1 | 9/2012 | Sherlekar et al. |

* cited by examiner

*Primary Examiner* — Jaehwan Oh  
(74) *Attorney, Agent, or Firm* — Blakely Sokoloff Taylor & Zafman LLP

(57) ABSTRACT

An integrated circuit chip includes CMOS integrated circuit cells arranged in a semiconductor layer, each including first and second active regions, having first and second polarities, respectively. A first power rail is routed along boundaries of the CMOS integrated circuit cells proximate to the first active regions. A second power rail is routed over second active regions. Global routing channels are routed over the second active regions such that the second power rail is disposed between the global routing channels and the first power rail. The global routing channels are coupled between the CMOS integrated circuit cells to couple the CMOS integrated circuit cells together globally in the integrated circuit chip.

14 Claims, 3 Drawing Sheets

US 9,136,267 B2

STANDARD CELL GLOBAL ROUTING CHANNELS OVER ACTIVE REGIONS

BACKGROUND INFORMATION

1. Field of the Disclosure

The present invention relates generally to application-specific integrated circuits, and more specifically, the present invention is directed to global routing channels in application-specific integrated circuits.

2. Background

Application-specific integrated circuits are integrated circuits that can be customized for specific uses or applications. In semiconductor design, digital standard cells are the building blocks that are used to design application-specific integrated circuits with digital logical functions.

Global routing between the standard cells in application-specific integrated circuits is required to complete logical functions. To increase the feasibility of routing throughout the entire chip, global routing channels between the standard cells of application-specific integrated circuits are sometimes needed, especially for those microchips that have fewer metal layers of routing. However, the global routing channels can decrease the fill ratio of standard cells in the application-specific integrated circuits as a consequence of the chip real estate that is occupied by the global routing channels. A low fill ratio can present serious challenges in semiconductor designs, such as for example increased chip sizes, higher costs, and lower circuit speeds.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
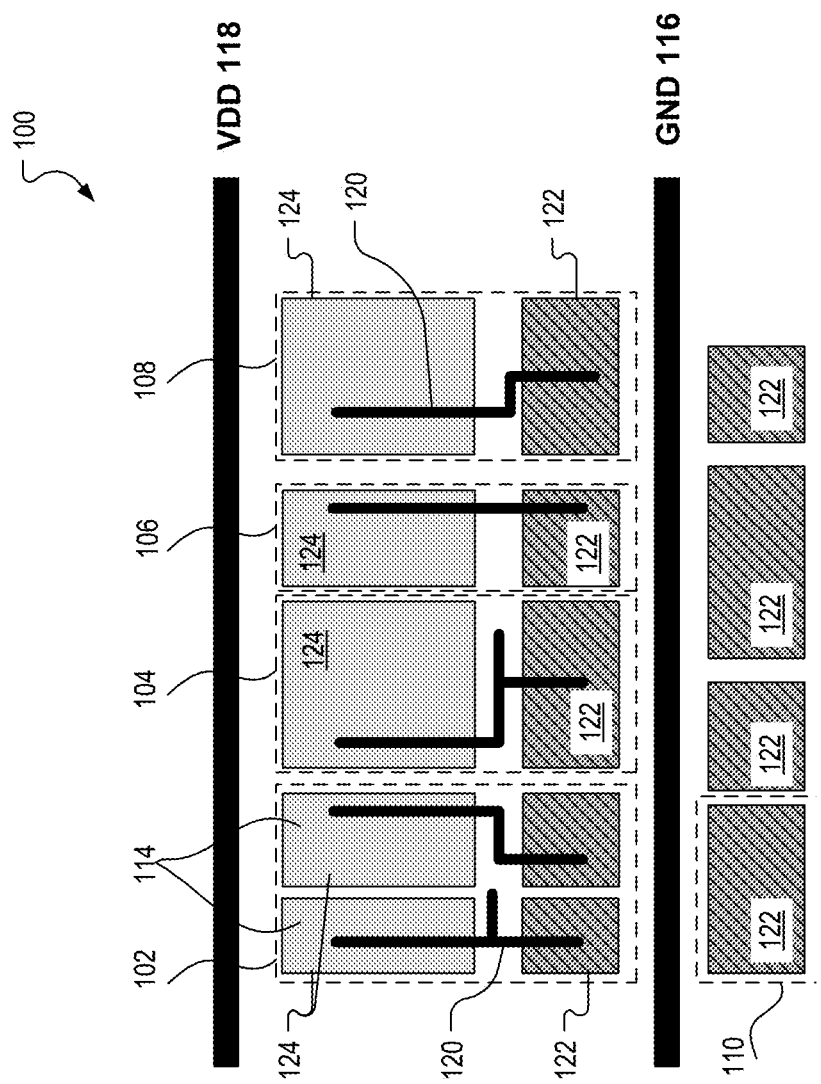
FIG. 1 is a diagram illustrating an example of an integrated circuit chip with standard cells of an application-specific integrated circuit.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As will be discussed, an example integrated circuit chip is disclosed that includes a plurality of standard complementary metal oxide semiconductor (CMOS) integrated circuit cells of an application-specific integrated circuit arranged in a semiconductor layer. In one example, each one of the standard CMOS integrated circuit cells includes an N doped metal oxide semiconductor (NMOS) active region and a P doped metal oxide semiconductor (PMOS) active region disposed in the semiconductor layer. In one example, a ground power rail is included in metal layers disposed over the semiconductor layer and routed along boundaries of the standard CMOS integrated circuit cells proximate to the NMOS active regions of the standard CMOS integrated circuit cells. In that example, a VDD power rail is included in the metal layers disposed over the semiconductor layer and is routed over the PMOS active regions of the standard CMOS integrated circuit cells. In the example, global routing channels are included in the metal layers over the semiconductor layer and are routed over the PMOS active regions of the CMOS integrated circuit cells such that the VDD power rail is disposed the metal layers between the global routing channels and the ground power rail. In the example, the global routing channels are coupled between the standard CMOS integrated circuit cells to couple the CMOS integrated circuit cells together globally in the integrated circuit chip.

To illustrate, FIG. 1 is a diagram illustrating one example of a CMOS integrated circuit chip 100 of an application-specific integrated circuit in which standard CMOS integrated circuit cells of the application-specific integrated circuit are arranged side-by-side to increase the fill ratio in accordance with the teachings of the present invention. As shown in FIG. 1, a plurality of standard cells 102, 104, 106, 108, and 110 are arranged in a semiconductor layer of integrated circuit chip 100. Each standard cell includes a respective first active region 122, and a respective second active region 124. In the example, the first active regions 122 are doped with dopants having a first polarity, and the second active regions 124 are doped with dopants having a second polarity. In one example, the first polarity dopants are N dopants, and the second polarity dopants are P dopants such that the first active regions 122 are NMOS active regions and the second active regions 124 are PMOS active regions. FIG. 1 also shows that local routing elements 120, which are disposed in the metal layers above the semiconductor layer, are coupled to each standard cell 102, 104, 106, 108, and 110 to couple together circuit elements, such as for example transistors 114, included in each standard cell 102, 104, 106, and 108 of the application-specific integrated circuit.

As shown in FIG. 1, the standard cells 102, 104, 106, and 108, arranged in the same row of standard cells are placed side-by-side in the semiconductor layer of integrated circuit chip 100 to have the highest filling ratio in accordance with the teachings of the present invention. The boundary of the NMOS active region 122 of standard cell 102 is proximate to the boundaries of the respective NMOS active regions 122 of standard cell 110. In so doing, the ground power rail 116 included in metal layers disposed over the semiconductor layer may be routed along boundaries of the standard cells 102, 104, 106, and 108 proximate to the NMOS active regions 122 of the standard cell 110.

Similarly, VDD power rail 118 is routed along the boundaries of PMOS active region 124 of standard cells 102, 104, 106 and 108, and the PMOS active region 124 of standard cells arranged in a row above (not shown). It is noted however, that by arranging standard cells 102, 104, 106, and 108 side-by-side as shown in FIG. 1, there is no space for global routing channels to couple together the standard cells 102, 104, 106, 108, and 110.

Figure 2:
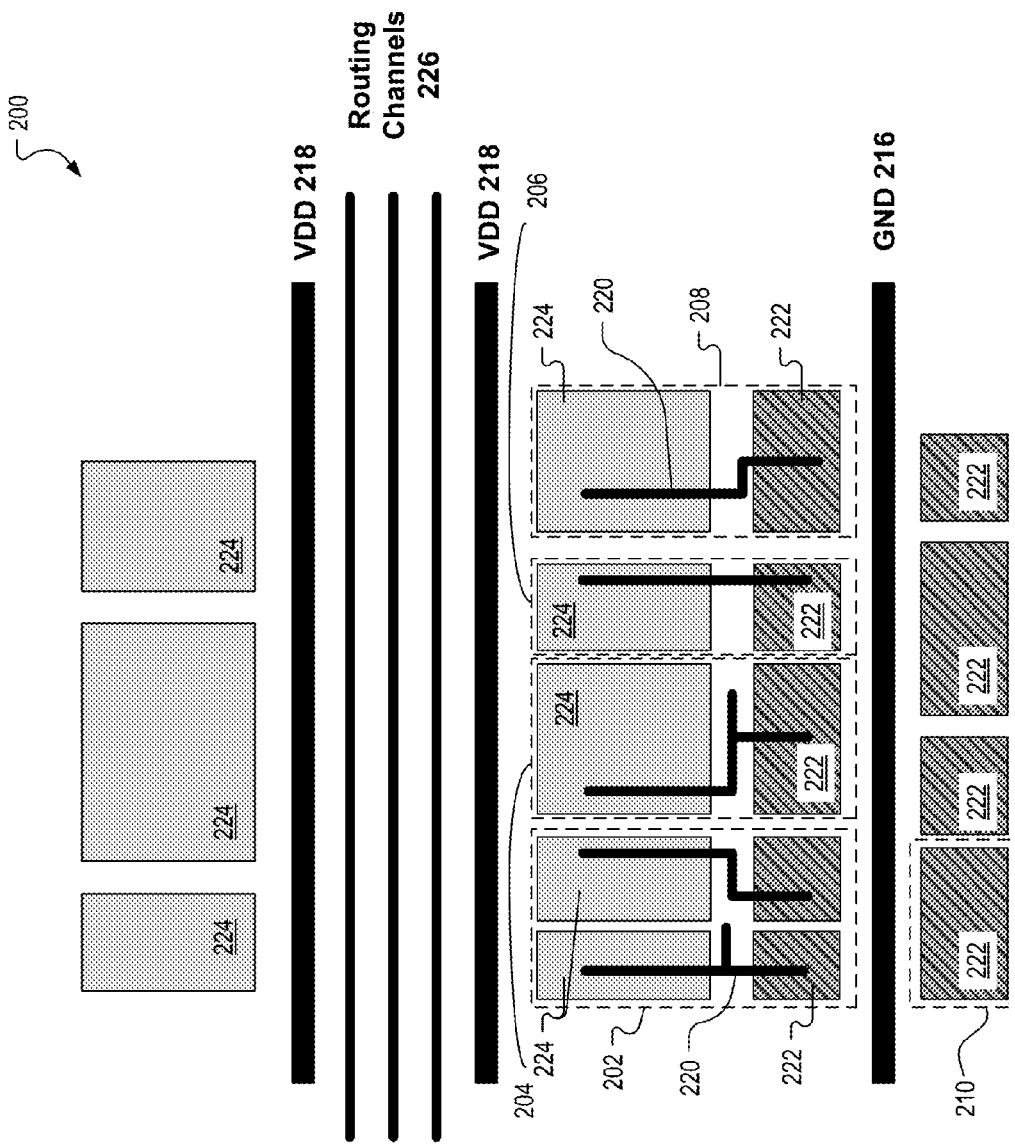
FIG. 2 is a diagram illustrating an example of an integrated circuit chip with global routing channels coupling together standard cells of an application-specific integrated circuit.

FIG. 2 is a diagram illustrating an example of an integrated circuit chip with global routing channels coupling together standard CMOS integrated circuit cells of an application-specific integrated circuit in which standard cells are arranged side-by-side to increase fill ratio in accordance with the teachings of the present invention. As shown in FIG. 2, a plurality of standard cells 202, 204, 206, 208, and 210 are arranged in a semiconductor layer of integrated circuit chip 200. Each standard cell includes a respective first active region 222, and a respective second active region 224. In the example, the first active regions 222 are doped with dopants having a first polarity, and the second active regions 224 are doped with dopants having a second polarity. In one example, the first polarity dopants are N dopants, and the second polarity dopants are P dopants such that the first active regions 222 are NMOS active regions and the second active regions 224 are PMOS active regions. FIG. 2 also shows that local routing elements 220, which are disposed in the metal layers above the semiconductor layer, are coupled to each standard cell 202, 204, 206, and 208 to couple together circuit elements, such as for example transistors 214, included in each standard cell 202, 204, 206, and 208 of the application-specific integrated circuit.

As shown in FIG. 2, the standard cells 202, 204, 206, and 208 arranged in the same row of standard cells are placed side-by-side in the semiconductor layer of integrated circuit chip 200 to have a high filling ratio. The boundary of the NMOS active region 222 of standard cell 202 is proximate to the boundaries of the NMOS active region 222 of standard cell 210. In so doing, the ground power rail 216 included in metal layers disposed over the semiconductor layer may be routed along boundaries of the standard cells 202, 204, 206, and 208 proximate to the respective NMOS active region 222 of the standard cell 210. Similarly, the VDD power rails 218 included in metal layers disposed over the semiconductor layer may be routed along the boundaries of the standard cells 202, 204, 206, and 208.

As shown in the example of FIG. 2, global routing channels 226 are inserted between the VDD power rails 218 to provide at least some global routing between the standard cells of the application-specific integrated circuit of integrated circuit 200. However, it is noted that by providing the global routing channels 226 between the standard cells as shown in FIG. 2, the fill ratio of the standard cells 202, 204, 206, 208, and 210 in integrated circuit 200 is reduced due to the additional chip real estate occupied by the global routing channels 226. As a consequence, the size and costs of integrated circuit chip 200 are undesirably increased and the clock frequencies of the circuits in integrated circuit chip 200 are undesirably decreased.

Figure 3:
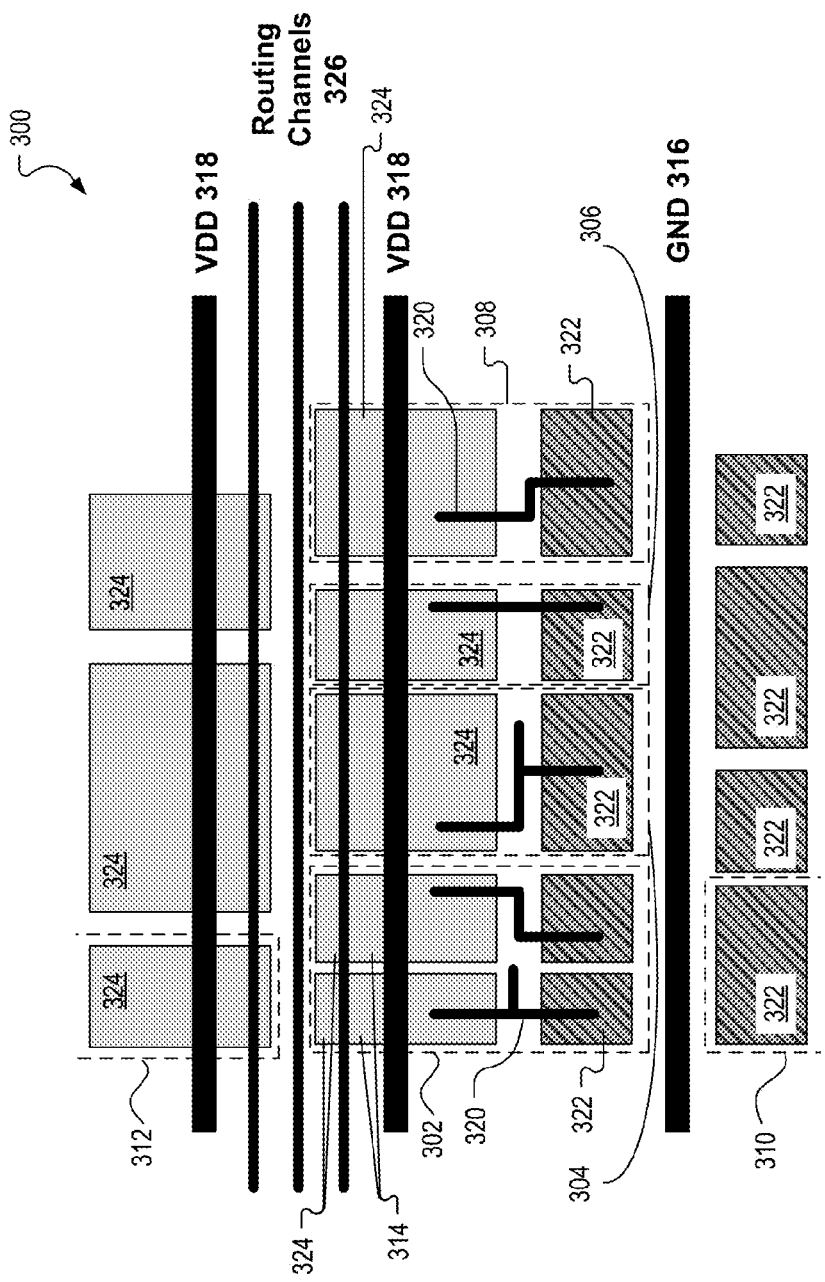
FIG. 3 is a diagram illustrating an example of an integrated circuit chip with global routing channels coupling together standard cells of an application-specific integrated circuit in accordance with the teachings of the present invention.

FIG. 3 is a diagram illustrating another example of an integrated circuit chip 300 with global routing channels coupling together standard cells of an application-specific integrated circuit in accordance with the teachings of the present invention. The example of integrated circuit 300 in accordance with the teachings of the present invention addresses trade-offs illustrated in the examples above in FIGS. 1-2 between providing global routing channels and increasing the fill ratio. In particular, the example illustrated in FIG. 3 shows a plurality of standard cells 302, 304, 306, 308, 310, and 312 that are arranged in a semiconductor layer of integrated circuit chip 300. Each standard cell includes a respective first active region 322, and a respective second active region 324. In the example, the first active regions 322 are doped with dopants having a first polarity, and the second active regions 324 are doped with dopants having a second polarity. In one example, the first polarity dopants are N dopants, and the second polarity dopants are P dopants such that the first active regions 322 are NMOS active regions and the second active regions 324 are PMOS active regions. FIG. 3 also shows that local routing elements 320, which are disposed in the metal layers above the semiconductor layer, are coupled to each standard cell 302, 304, 306, 308, 310, and 312 to couple together circuit elements, such as for example transistors 314, included in each standard cell 302, 304, 306, 308, 310, and 312 of the application-specific integrated circuit. In the illustrated example, the local routing elements 320 are restricted to be arranged between VDD power rails 318 as shown in FIG. 3.

As shown in FIG. 3, the standard cells 302, 304, 306, and 308 arranged in the same row of standard cells are placed side-by-side in the semiconductor layer of integrated circuit chip 300 to have the highest filling ratio. The boundary of the NMOS active region 322 of standard cell 302 is proximate to the boundaries of the NMOS active regions 322 of standard cell 310. In so doing, the ground power rail 316 included in metal layers disposed over the semiconductor layer may be routed along boundaries of the standard cells 302, 304, 306 and 308 proximate to the respective NMOS active regions 322 of the standard cells 310. In one example, the ground power rail 316 is included in the first metal layer that is disposed closest to the semiconductor layer. It is noted that this first metal layer that is disposed closest to the semiconductor layer is sometimes referred to as an M1 metal layer.

Furthermore, FIG. 3 also shows that the VDD power rail 318 included in metal layers disposed over the semiconductor layer is routed over the respective PMOS active regions 324 of the standard cells 302, 304, 306, and 308 in accordance with the teachings of the present invention. FIG. 3 also shows that the VDD power rail 318 is also routed over the respective PMOS active regions 324 of the standard cell 312 in accordance with the teachings of the present invention. In one example, the VDD power rail 316 is included in the first metal layer that is disposed closest to the semiconductor layer, which is also referred to as the M1 metal layer.

As shown in the example of FIG. 3, global routing channels 326 included in metal layers disposed over the semiconductor layer are also routed over the respective PMOS active regions 324 of the standard cells 302, 304, 306, 308, and 312 in accordance with the teachings of the present invention. As such, the VDD power rail 318 is disposed in the metal layers between the global routing channels 326 and the ground power rail 316. In the example, the global routing channels 326 are coupled between the standard cells to couple the standard cells together globally in the integrated circuit chip 300 in accordance with the teachings of the present invention. In one example, the global routing channels 326 may be included in all of the metal layers that are disposed above semiconductor layer (e.g., M1, M2, etc.).

As shown in the example depicted in FIG. 3, the local routing elements 320 are restricted to being disposed over the respective NMOS active regions 322 and a portion of the PMOS active region 324 in each standard cell on one side of the VDD power rail 318, while the global routing channels 326 are restricted to being disposed over another portion of the PMOS active regions 324 on an opposite side of the VDD power rail 318.

Therefore, it is appreciated that FIG. 3 shows that the transistors 314 included in the standard cells are extended into the routing channels 326 in accordance with the teachings of the present invention. In so doing, the transistors 314 occupy the lower space below the routing channel 326, and the metal used for the routing channels occupy the upper space in the integrated circuit chip 300 in accordance with the teachings of the present invention. Thus, the standard cells arranged in the same row of standard cells are can be arranged side-by-side the semiconductor layer of integrated circuit 300 to increase the fill ratio, while at the same time provide global routing channels 326 to provide global coupling between all of the standard cells of integrated circuit 300 in accordance with the teachings of the present invention.

It is noted that in the illustrated example, the global channels 326 are routed over the PMOS active regions 324 of each respective standard cell because the PMOS active regions 324 are typically 2 to 3 times larger than the NMOS active regions 322. However, it is appreciated that in other examples, the global channels 326 may be routed over the NMOS active regions 322 in accordance with the teachings of the present invention.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An integrated circuit chip, comprising:
a plurality of complementary metal oxide semiconductor (CMOS) integrated circuit cells arranged in a semiconductor layer, wherein each one of the CMOS integrated circuit cells includes first and second active regions disposed in the semiconductor layer, wherein the first active region is doped with dopants having a first polarity, and wherein the second active region is doped with dopants having a second polarity;
a first power rail included in metal layers disposed over the semiconductor layer and routed along boundaries of the CMOS integrated circuit cells proximate to the first active regions of the CMOS integrated circuit cells;
a second power rail included in the metal layers disposed over the semiconductor layer and routed over second active regions of the CMOS integrated circuit cells; and
global routing channels included in the metal layers over the semiconductor layer and routed over the second active regions of the CMOS integrated circuit cells such that the second power rail is disposed the metal layers between the global routing channels and the first power rail, wherein the global routing channels are coupled between the CMOS integrated circuit cells to couple the CMOS integrated circuit cells together globally in the integrated circuit chip.

2. The integrated circuit chip of claim 1 wherein each one of the CMOS integrated circuit cells comprises local routing elements disposed in the metal layers between the first and second rails to couple together circuit elements of the CMOS integrated circuit cell, wherein the local routing elements are restricted to being disposed over the first active region and a portion of second active region on one side of the second power rail, and wherein the global routing channels are restricted to being disposed over another portion of the second active region on an opposite side of the second power rail.

3. The integrated circuit chip of claim 1 wherein the first active regions comprise N doped metal oxide semiconductor (NMOS) active regions, and wherein the second active regions comprise P doped metal oxide semiconductor (PMOS) active regions.

4. The integrated circuit chip of claim 1 wherein the first power rail comprises a ground power rail and wherein the second power rail comprises a VDD power rail.

5. The integrated circuit chip of claim 1 wherein the metal layers comprise a plurality of metal layers, wherein the first and second power rails are included in a first metal layer disposed closest to the semiconductor layer.

6. The integrated circuit chip of claim 5 wherein the global routing channels are included in all of the plurality of metal layers.

7. The integrated circuit chip of claim 1 wherein the plurality of CMOS integrated circuit cells are arranged side-by-side in the semiconductor layer such that the first active region of a first one of the CMOS integrated circuit cells positioned proximate to the first active region of a second one of the CMOS integrated circuit cells, wherein the first power rail is routed along a boundary between the first active region of the first one of the CMOS integrated circuit cells and the first active region of the second one of the CMOS integrated circuit cells.

8. An application-specific integrated circuit, comprising:
a plurality of standard cells including a plurality of transistors arranged in a semiconductor layer, wherein each one of the standard cells includes first and second active regions disposed in the semiconductor layer, wherein the first active region is doped with dopants having a first polarity, and wherein the second active region is doped with dopants having a second polarity;
a first power rail included in metal layers disposed over the semiconductor layer and routed along boundaries of the standard cells proximate to the first active regions of the standard cells;
a second power rail included in the metal layers disposed over the semiconductor layer and routed over second active regions of the standard cells; and
global routing channels included in the metal layers over the semiconductor layer and routed over the second active regions of the standard cells such that the second power rail is disposed in the metal layers between the global routing channels and the first power rail, wherein the global routing channels are coupled between the standard cells to couple the standard cells together globally in the application-specific integrated circuit.

9. The application-specific integrated circuit of claim 8 wherein each one of the standard cells comprises local routing elements disposed in the metal layers between the first and second rails to couple together the transistors of the standard cell, wherein the local routing elements are restricted to being disposed over the first active region and a portion of second active region on one side of the second power rail, and wherein the global routing channels are restricted to being disposed over another portion of the second active region on an opposite side of the second power rail.

10. The application-specific integrated circuit of claim 8 wherein the first active regions comprise N doped metal oxide semiconductor (NMOS) active regions, and wherein the second active regions comprise P doped metal oxide semiconductor (PMOS) active regions.

11. The application-specific integrated circuit of claim 8 wherein the first power rail comprises a ground power rail and wherein the second power rail comprises a VDD power rail.

12. The integrated circuit chip of claim 1 wherein the metal layers comprise a plurality of metal layers, wherein the first and second power rails are included in a first metal layer disposed closest to the semiconductor layer.

13. The integrated circuit chip of claim 12 wherein the global routing channels are included in all of the plurality of metal layers.

14. The application-specific integrated circuit of claim 8 wherein the plurality of standard cells are arranged side-by-side in the semiconductor layer such that the first active region of a first one of the standard cells positioned proximate to the first active region of a second one of the standard cells, wherein the first power rail is routed along a boundary between the first active region of the first one of the standard cells and the first active region of the second one of the standard cells.

* * * * *